United States Patent
Zundel et al.

(10) Patent No.: US 6,885,062 B2
(45) Date of Patent: Apr. 26, 2005

(54) MOS TRANSISTOR DEVICE WITH A LOCALLY MAXIMUM CONCENTRATION REGION BETWEEN THE SOURCE REGION AND THE DRAIN REGION

(75) Inventors: Markus Zundel, Taufkirchen (DE); Franz Hirler, Isen (DE); Roberta Lantier, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/371,134

(22) Filed: Feb. 21, 2003

(65) Prior Publication Data

US 2003/0173618 A1 Sep. 18, 2003

(30) Foreign Application Priority Data

Feb. 21, 2002 (DE) .......................................... 102 07 309

(51) Int. Cl.[7] .......................... H01L 23/00; H01L 29/76; H01L 29/78
(52) U.S. Cl. ....................... 257/335; 257/330; 257/331; 257/332; 257/333; 257/341
(58) Field of Search ................................ 257/330, 331, 257/332, 333, 335, 341, E21.419, E29.198, E29.2, E29.201, E29.259, E29.26

(56) References Cited

U.S. PATENT DOCUMENTS

| | | | |
|---|---|---|---|
| 4,941,026 A | 7/1990 | Temple | |
| 5,072,266 A | 12/1991 | Bulucea et al. | |
| 5,998,833 A | 12/1999 | Baliga | |
| 6,072,215 A | 6/2000 | Kawaji et al. | |
| 6,285,060 B1 | 9/2001 | Korec et al. | |
| 2001/0045599 A1 | 11/2001 | Hueting et al. | |
| 2002/0093050 A1 * | 7/2002 | Hirler et al. ................ | 257/330 |

FOREIGN PATENT DOCUMENTS

| | | | |
|---|---|---|---|
| WO | WO 01/01484 A2 * | 1/2001 | |
| WO | WO 02/01644 A2 | 1/2002 | |

* cited by examiner

*Primary Examiner*—Minhloan Tran
*Assistant Examiner*—Thomas L Dickey
(74) *Attorney, Agent, or Firm*—Laurence A. Greenberg; Werner H. Stemer; Gregory L. Mayback

(57) ABSTRACT

In order to obtain an on resistance that is as low as possible, it is proposed, in the case of a MOS transistor device, to form the avalanche breakdown region in an end region of a trench structure. As an alternative or in addition, it is proposed to form a region of local maximum dopant concentration of a first conductivity type in the region between a source and a drain in proximity to the gate insulation in a manner remote from the gate electrode.

33 Claims, 2 Drawing Sheets

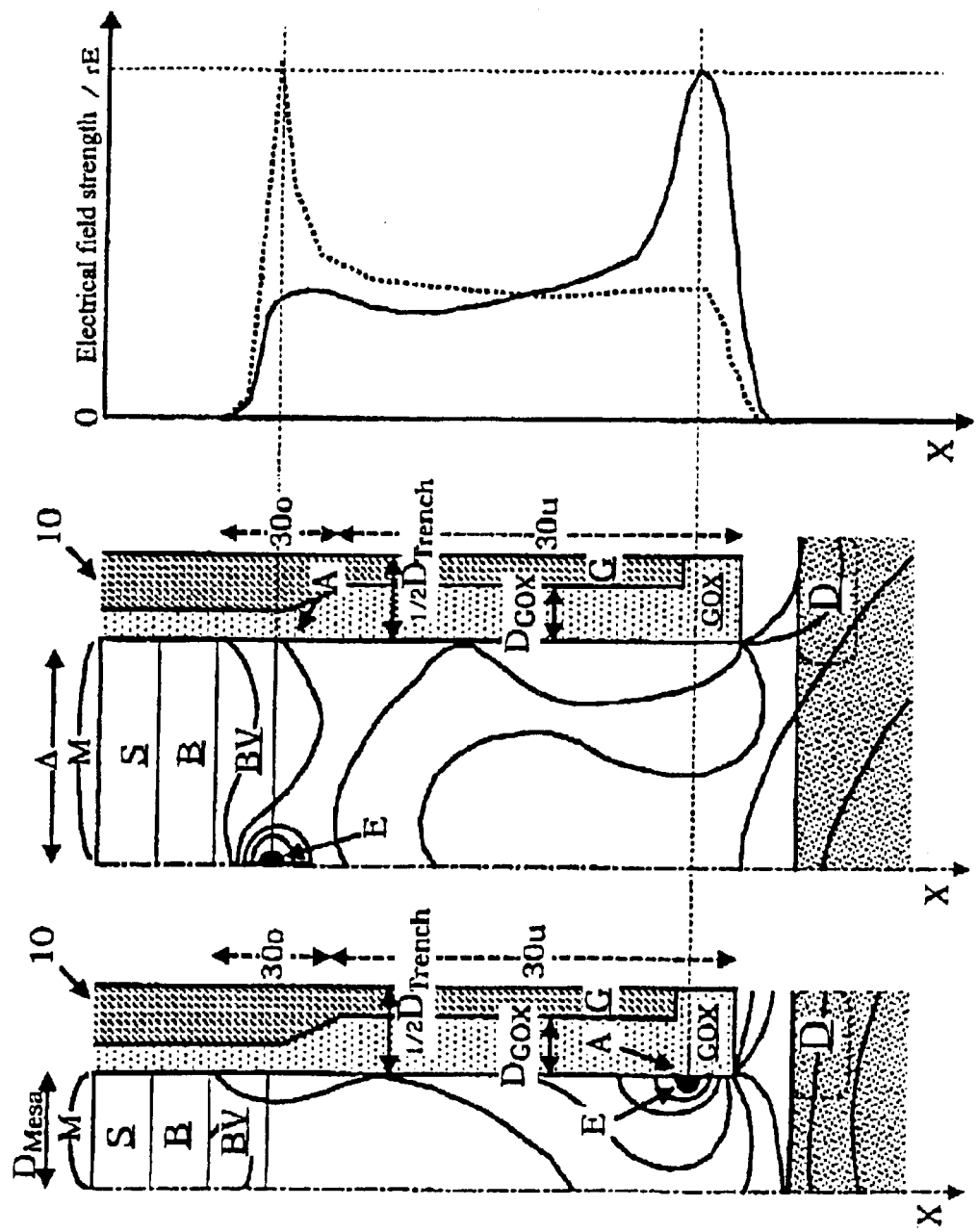

MOS TRANSISTOR DEVICE WITH A LOCALLY MAXIMUM CONCENTRATION REGION BETWEEN THE SOURCE REGION AND THE DRAIN REGION

BACKGROUND OF THE INVENTION

Field of the Invention

The invention relates to a MOS transistor device having a trench structure extending substantially in a first direction in the semiconductor region.

In modern MOS transistors, in particular in the power semiconductor field, an essential criterion in assessing the function is the on resistance of the respective MOS transistor device.

The further development of modern transistor technologies often aims to reduce the on resistivity, so that the static power loss can be minimized and larger current densities can be achieved, thus resulting in the possibility of miniaturization of the chips in conjunction with cost-effective production.

Known measures for reducing the on resistivity of MOS transistors use, instead of a planar cell structure, trench cells in which the MOS transistor is formed in the region of a trench or trench structure which accommodates the gate electrode and the gate terminal. By virtue of this measure, the channel resistance, in particular, is lowered through the increase in the channel width. Furthermore, the resistance of the drift path can be reduced further by using deep trenches or trench structures. Specific doping measures reduce the drift path resistance further.

SUMMARY OF THE INVENTION

It is accordingly an object of the invention to provide a MOS transistor device that overcomes the above-mentioned disadvantages of the prior art devices of this general type, which has a particularly low on resistance and can be provided in conjunction with functional reliability.

With the foregoing and other objects in view there is provided, in accordance with the invention, a MOS transistor device. The MOS transistor device contains a semiconductor region having a trench structure formed therein extending substantially in a given direction, and an avalanche breakdown region formed in an end region of the trench structure, a lower region of the trench structure, or a bottom region of the trench structure resulting in a low on resistance for the MOS transistor device.

The first way of achieving the object according to the invention proceeds from a MOS transistor device of the trench structure or trench type with a trench structure extending essentially in a first direction in a semiconductor region.

The first MOS transistor device according to the invention is characterized in that the avalanche breakdown region of the MOS transistor device is formed in an end region or in a lower region of the trench structure, in particular in the region of the bottom thereof, in such a way that, as a result, a particularly low on resistance of the MOS transistor device is formed or can be formed.

It is thus a basic concept, of the first solution according to the invention, to form the avalanche breakdown region of the MOS transistor device according to the invention in an end region of the trench structure. In the case of a vertical MOS transistor device with a correspondingly vertically oriented trench structure or a vertical trench, in this case the end region provided is, in particular, a lower region of the trench structure, in particular a region of the bottom thereof. As a consequence of moving the avalanche breakdown region in to the end region or lower region of the trench structure or trench, the so-called avalanche strength or the breakdown voltage of the MOS transistor device according to the invention is increased. The increase in the breakdown voltage as a result of moving the avalanche breakdown region into the lower region or end region of the trench structure can be used to raise the concentration of the corresponding ambient doping, in particular of the epitaxial zone. Part of the increase in the breakdown voltage is lost again in this case. This can be accepted, however, since the breakdown voltage used for operation lies below the increased breakdown voltage. A higher doping that can then be carried out in this case, in particular of the epitaxial zone, decreases the on resistance of the MOS transistor device according to the invention in the intended manner.

The other way of achieving the object according to the invention proceeds from a MOS transistor device having a source region and a drain region, which are formed in a semiconductor region with a first conductivity type. A gate electrode device is provided essentially between, the source region and drain region in a manner insulated by an insulation region.

The second solution according to the invention is characterized in that a region of locally maximum dopant concentration of the first conductivity is provided essentially between the source region and the drain region in direct proximity to the insulation region in a manner remote from the gate electrode device in such a way that, as a result, a particularly low on resistance of the MOS transistor device is formed or can be formed.

It is thus a core concept of the second solution according to the invention to modulate and/or to increase the dopant concentration in a region between the source region and the drain region in such a way that a region of local maximum dopant concentration of the first conductivity type forms there. As a result, the breakdown voltage of the MOS transistor device is elevated in a manner dependent on the magnitude of the local concentration maximum and on the position and form thereof. The elevation of the breakdown voltage can then again be utilized to raise the concentration of the ambient dopings, as a result of which the elevated breakdown voltage is decreased in an additional manner and, at the same time, the on resistance of the MOS transistor device according to the invention in accordance with the second solution proposal is likewise reduced.

In principle, it must be emphasized, then, that the decrease in the on resistance can be achieved, according to the invention, by two measures that can be carried out independently of one another. The first measure consists quite generally in the formation of the avalanche breakdown region in the end region of the trench structure, in particular in the region of the trench bottom. The second measure consists in the formation of a local dopant concentration maximum in a region between the source and the drain.

The two measures can be combined with one another in order to achieve a further reduction of the on resistance of the MOS transistor devices according to the invention in a particularly advantageous manner.

Thus, in accordance with a preferred embodiment of the first solution according to the invention, provision is made, in the case of a MOS transistor device in which the source region and the drain region are formed in a semiconductor region with a first conductivity type and in which a gate electrode device is provided essentially in between in the interior of the trench structure in a manner insulated by an insulation region, for providing a region of local maximum dopant concentration of the first conductivity type essentially between the source region and the drain region in direct proximity to the insulation region in a manner remote from the gate electrode device in such a way that, as a result, a particularly low on resistance of the MOS transistor device is formed or can be formed.

Accordingly, in an alternative embodiment of the second way in which the object is achieved according to the invention, provision is made for forming the MOS transistor device of the trench structure type or trench type with a trench structure extending essentially in a first direction in the semiconductor region and, in this case, for forming the avalanche breakdown region of the MOS transistor device in an end region or lower region of the trench structure, in particular in the region of the bottom thereof, in such a way that, as a result, a particularly low on resistance of the MOS transistor device is formed or can be formed.

The fundamental idea of forming the avalanche breakdown region of the MOS transistor device according to the invention in an end region or lower region, in particular bottom region, of the trench structure can be realized in various ways.

A preferred embodiment provides for the avalanche breakdown region to be formed by a region of maximum electric field strength or to be defined by the region.

This can be ensured for example by the corresponding configuration of the source and/or drain terminals and/or the proximity to other components, because the respective MOS transistor device is generally not situated by itself in the respective semiconductor region, but rather is in direct proximity to other semiconductor devices, for example other transistors or the like.

In this case, in accordance with a preferred embodiment of the invention, in particular, the region of maximum electric field strength may be formed between the source region and the drain region in direct proximity to the insulation region and in direct proximity to the end region or lower region of the trench structure in a manner remote from the gate electrode. In particular, in this case the region of maximum electric field strength lies directly at the outer side of the trench wall in the lower region of the trench structure, that is to say, for example, in the vicinity of the trench bottom.

In another embodiment of the MOS transistor device according to the invention, it is provided that the region of maximum field strength is formed between the source region and the drain region in direct proximity to the end region or lower region of the trench structure and in a manner remote from the gate electrode device. This is preferably done in the region of a space charge zone which extends, in particular, between a provided body region or a provided body reinforcement region and the drain region, in particular when breakdown voltage is present, and there in the second, lower half, or half facing the drain region, thereof.

In a particularly preferred embodiment of the MOS transistor devices according to the invention, it is provided that the mesa region as an intermediate region has in a direction running essentially perpendicular to the first direction, in particular toward an adjacent semiconductor device, a width $D_{Mesa}$ which is less than a width $D_{Trench}$ of the trench structure or trench itself in the direction, so that the following holds true: $D_{Mesa} < D_{Trench}$. This measure of narrowing of the mesa width and thus of denser proximity of adjacent components thus achieves not only a higher integration density of the semiconductor components but also the reduction—according to the invention—of the on resistances of MOS transistor devices according to the invention.

In a further preferred embodiment, it is provided that the mesa region as an intermediate region has in a direction running essentially perpendicular to the first direction, in particular toward an adjacent semiconductor device, a width $D_{mesa}$ which is less than 2.5 times the maximum thickness $D_{GOX}$ of the gate insulation region GOX, so that the following holds true: $D_{mesa} < 2.5\ D_{GOX}$.

In this case, it must be taken into account that the mesa width $D_{Mesa}$ is permitted to be restricted only to the extent allowed by the interaction of adjacent semiconductor devices or semiconductor components. The electric fields of adjacent semiconductor components isolated by the mesa region respectively provided must not influence one another in such a way as to produce a negative tendency with regard to the breakdown voltage.

The last-mentioned measure of relating the mesa width to the maximum thickness of the insulation region or the gate insulation can be utilized particularly advantageously when the MOS transistor device according to the invention is formed as a field plate transistor device, the insulation region having a field plate structure.

It is furthermore provided that a body region of a second conductivity type is formed essentially, between the source region and the drain region in a manner insulated from the gate electrode device, in particular in direct proximity to the source region.

In this case, it is provided that the body region is formed such that it is reinforced toward the drain region with a body reinforcement region of the second conductivity type.

It is particularly preferred that the region of local maximum dopant concentration of the first conductivity type is provided in the region of a position located in the transition from the body region or body reinforcement region to a doping spur of the drain region.

In a further advantageous embodiment of the MOS transistor device according to the invention, it is provided that a possibly formed trench structure is formed such that it reaches approximately as far as the first semiconductor subregion of the semiconductor region, as far as the substrate and/or right into the substrate of the MOS transistor device.

In another advantageous embodiment of the MOS transistor device according to the invention, it is provided that a plurality of electrodes or electrode devices are formed in the possibly provided trench structure. The electrodes or electrode devices may form, in particular, a plurality of gate regions and, as an alternative or in addition, a plurality of source regions. In a further advantageous embodiment of the MOS transistor device according to the invention, it is provided that the drain region or the terminal region therefore is formed on the same side of the semiconductor region as the source region or the terminal region therefore while avoiding rear side contact connections of the semiconductor region to the greatest possible extent, the first semiconductor subregion, in particular in highly n-doped form, serving as terminal zone and being formed in laterally offset fashion such that it extends as far as the surface region of the semiconductor region or of the second semiconductor subregion thereof.

These and further aspects of the present invention are now explained.

In the development of new generations of MOS or DMOS power transistors, an important aim is to reduce the on resistivity $R_{on}$. This makes it possible, on the one hand, to minimize the static power loss. On the other hand, it is possible to achieve higher current densities, as a result of which it is possible to use smaller and less expensive chips for the same total current.

One method of reducing the on resistivity consists in departing from the planar cell structure and using trench cells. As a result, the channel resistance, in particular, is lowered through an increase in the channel width per area. The resistance of the drift path (epitaxial resistance) can be reduced by using deep trenches. A doping which increases in the entire epitaxial zone is proposed in order to reduce the drift path resistance further.

It is also proposed to reduce the mesa width in field plate trench transistors to an extent such that the avalanche breakdown takes place in the silicon in the lower trench region, in particular the mesa width being narrower than the trench width and/or the mesa width being narrower than 2.5 times the maximum oxide thickness in the trench.

By contrast, transistors constructed according to the prior art tend toward breakdown at the oxide edge. Special measures compel a breakdown in the cell center.

Although a breakdown in the trench bottom region leads to an incorporation of charge carriers into the oxide and to a drift in the breakdown voltage, the drift saturates and, therefore, does not constitute a reliability problem. What is essential is that no drift in the threshold voltage is brought about as a result.

Furthermore, it is proposed, for field plate trench transistors, to vary the doping of the drift path in such a way, that there is a maximum in the dopant concentration between the pn junction of the body epitaxial zone and the doping spur of the substrate. As a result, at least with very narrow mesa zones, the profile of the electric field strength over the depth can be improved in the direction of a constant electric field. This leads both to a lower $R_{on} \cdot A$ and to a higher breakdown voltage.

The basic ideas of the invention are moving the breakdown location from the cell center (in the case of body reinforcement implantation) or oxide edge into the region of the trench bottom by (greatly) decreasing the mesa width and, as an alternative or in addition, introducing a zone of increased doping, in particular n-type doping, in the epitaxial zone that is normally kept constant.

Other features which are considered as characteristic for the invention are set forth in the appended claims.

Although the invention is illustrated and described herein as embodied in a MOS transistor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2A is an illustration qualitatively showing a field strength distribution in the case of an embodiment of the MOS transistor device according to the prior art;

FIG. 2B is an illustration qualitatively showing the field strength distribution in the case of an embodiment of the MOS transistor according to the invention; and FIG. 2C is a graph showing a profile of the magnitude of the electric field strength in the mesa region as a function of the depth in the semiconductor material.

DESCRIPTION OF THE PREFERRED EMBODIMENTS

Figures 1A, 1B:
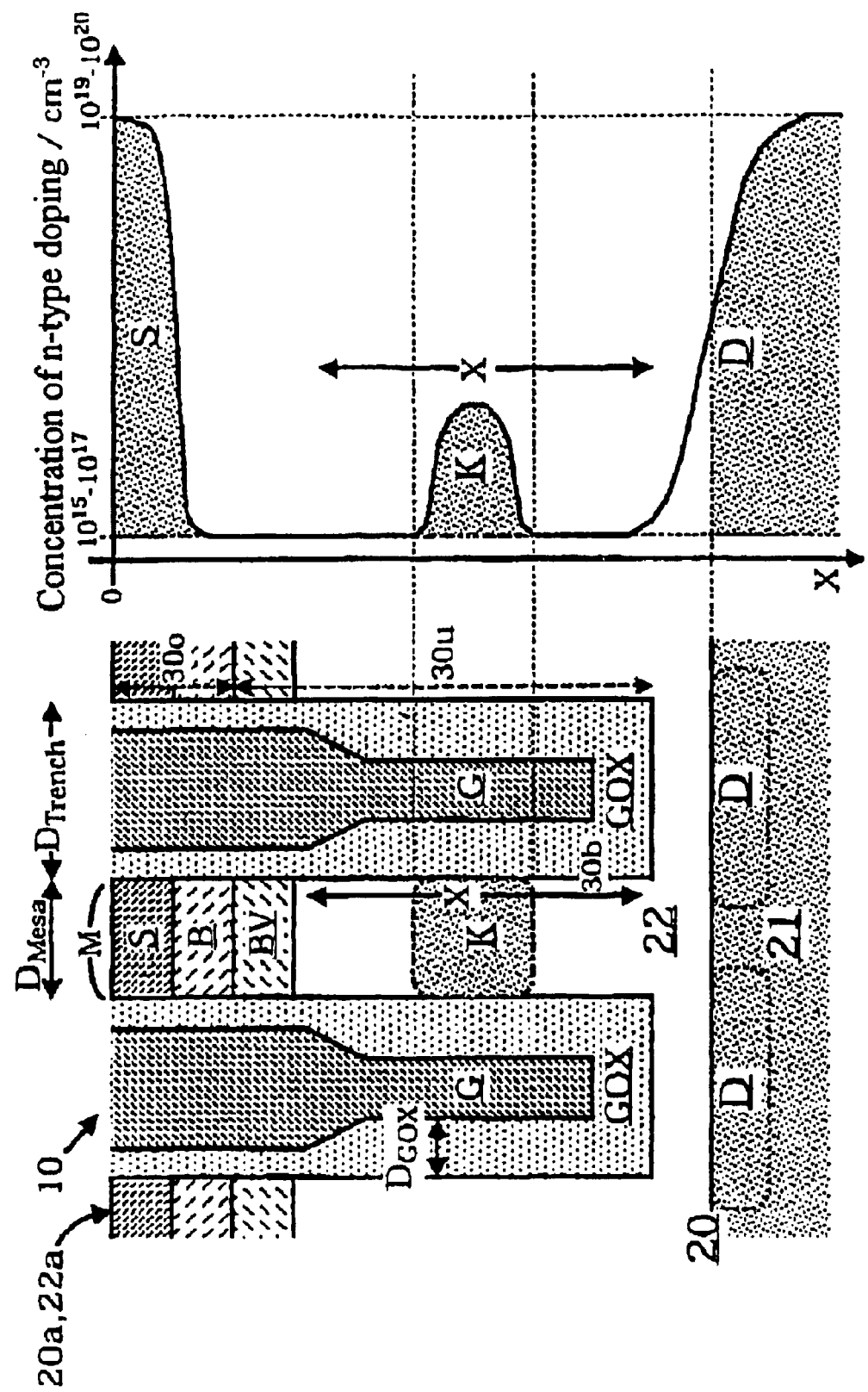
FIG. 1A is a diagrammatic, sectional side view of an embodiment of a MOS transistor device according to the invention.
FIG. 1B is a graph illustrating a profile of a dopant concentration in a mesa region as a function of depth in a semiconductor material according to the invention.

Referring now to the figures of the drawing in detail and first, particularly, to FIG. 1A thereof, there is shown in lateral cross-sectional view of a semiconductor circuit configuration having two MOS transistor devices 10 formed according to the invention.

The MOS transistor devices 10 formed according to the invention are formed in a semiconductor region 20 such that they are adjacent to one another in a manner isolated by a mesa region M having a thickness $D_{Mesa}$, to be precise in a semiconductor subregion 22 thereof which is essentially initially at most lightly doped. Each MOS transistor device 10 formed according to the invention has a trench 30 or a trench structure 30 having a width $D_{Trench}$.

The wall regions of the trench structures 30 are lined with a gate oxide GOX serving as an insulation region GOX. The gate oxide GOX has a maximum thickness $D_{GOX}$ in a lower region 30$u$ or end region 30$u$ of the trench structure 30. The gate oxide GOX is made much narrower in an upper region 30$o$ of the trench structure 30.

Formed adjacent to the upper region 30$o$ of the trench structure 30 is a source region S, here with an n-type doping. Situated below the source region S, are a body region B and a corresponding body reinforcement region BV being P-doped regions. Provided below the MOS transistor devices 10 according to the invention, and in particular below the first semiconductor subregion 22, is a further semiconductor subregion 21 with n-type doping, which forms a drain region D of the MOS transistor device 10.

The respective trench structure 30 also has in each case a gate electrode G in its interior, so that the configuration of the source S, the drain D and the gate G with addition of the gate insulation region GOX forms a customary vertical trench MOS transistor device.

In the vertical intermediate region between the drain region D on one side and the source S, the body region B and the body reinforcement region BV, on the other side, in the mesa region M of the respective MOS transistor device 10 according to the invention, there is provided in a region of a position X a region K of local maximum dopant concentration of the n type, which, according to the invention, lowers the on resistance of the MOS transistor devices 10 according to the invention.

The concentration of n-type dopings, which is dependent on a depth X in the semiconductor region 20, is illustrated in the graph of FIG. 1B. The dopant concentration of n-type dopings is represented on the abscissa running toward the right, while the depth X in the mesa region in the cell center between the MOS transistor devices 10 of FIG. 1A is designated on the ordinate pointing downward.

In principle, the n-type doping in the region of mesa M in the case of the prior art is comparatively low, being about $10^{15}$–$10^{17}$ cm$^{-3}$ there. By contrast, the drain region D in the second semiconductor subregion 21 is comparatively highly n-doped, to be precise about $10^{19}$–$10^{20}$ cm$^{-3}$. The source region S is likewise highly n-doped.

The inventive idea of providing the region K of local maximum dopant concentrations then has the effect of raising the concentration of n-type dopings in the region of the position X between the source S, the body B, the body reinforcement region BV and the drain D. The position X at the maximum of the n-type doping and the form and profile of the n-type doping can be varied in order to adapt the breakdown voltage and, consequently, the on resistance in accordance with the requirements.

In FIGS. 2A–C, the distributions of an electric field in the mesa regions M in the case of the prior art with a normal mesa width $\Delta$ and in the case of the MOS transistor device 10 formed according to the invention with a reduced mesa width $D_{Mesa}$ are compared with one another.

FIGS. 2A and 2B show the MOS transistor device 10 from the prior art and, respectively, the MOS transistor device 10 according to the invention with a customarily dimensioned mesa width $\Delta$ and, respectively, a reduced mesa width $D_{Mesa}$ which is less than 2.5 times the maximum gate oxide width $D_{GOX}$. In this case, the lines in each case designate sections of areas with a constant magnitude of the electric field strength.

In the case of the prior art in accordance with FIG. 2A, a field strength primary maximum is produced approximately in a cell center, that is to say between two adjacent MOS transistor devices to be precise in the region of the oxide edge, in other words in the region of the transition from the thin gate oxide layer GOX in the upper trench region 30o to the reinforced field plate region 30u, so that the avalanche breakdown is expected there. In the vertical profile of the rest of the mesa, that is to say along the drift path, the magnitude of the electric field strength has an approximately constant profile. Above the field strength maximum and below the trench bottom 30b, field strength falls very rapidly to zero.

In contrast to this, on account of the great reduction of the mesa width $D_{Mesa}$ in the case of the MOS transistor device 10 according to the invention in accordance with FIG. 2B, the field strength magnitude maximum is greatly reduced in the region of the cell center and the oxide edge. However, a highly pronounced field strength magnitude maximum is present in the region of the trench bottom 30b of the trench structure 30, to be precise in direct proximity and adjoining the insulation region GOX, so that the avalanche breakdown is expected there.

FIG. 2C shows the profile of the magnitude of the electric field strength along the cell center in the mesa region M in dotted form for the prior art and as a solid line for the MOS transistor device according to the invention as shown in FIG. 2B. The comparison reveals very clearly that, in the case of the prior art, the maximum field strength is present in the region of the upper oxide edge, so that the avalanche breakdown is expected there, whereas, in the case of the field strength profile according to the invention, the maximum is formed in the region of the trench bottom 30b, which can lead to an avalanche breakdown there.

The exact value or range of values for the on resistance $R_{on}$ in a trench capacitor strongly depends on the type of transistor (i.e. low, medium, or high voltage transistor) as well as on the architecture and technology used in producing the transistor. Therefore the phrase low on resistance is meant in comparison to conventional trench transistors, in particular in comparison to trench transistors where the avalanche breakdown region is formed and situated in a conventional manner and in particular not in an end region, a lower region or a bottom region of the trench structure. For example, using the present invention, the surface specific on resistance $R_{on}*A$ of a trench capacitor is reduced approximately 50% as compared to the prior art. For instance, in the voltage class of a 60 V transistor built according to the prior art, the prior art 60 V transistor would have a standard surface specific on resistance $R_{on}*A$ of approximately 80 m$\Omega*$mm$^2$. In comparison, if the 60 V transistor were built according to the invention, it would have a specific on resistance $R_{on}*A$ of approximately 40 m$\Omega*$mm$^2$ or about half that of the 60 V transistor built according to the prior art.

We claim:

1. A MOS transistor device, comprising:
   a semiconductor region having a trench structure formed therein extending substantially in a given direction;
   an avalanche breakdown region formed in a region selected from the group consisting of an end region of said trench structure, a lower region of said trench structure, and a bottom region of said trench structure resulting in a low on resistance for the MOS transistor device;
   a source region having a first conductivity type and formed in said semiconductor region;
   a drain region having said first conductivity type and formed in said semiconductor region;
   a gate electrode device formed substantially between said source region and said drain region in an interior of said trench structure;
   an insulation region disposed in said trench structure and insulating said gate electrode device;
   a region having a locally maximum dopant concentration of said first conductivity type disposed between said source region and said drain region in direct proximity to said insulation region and remote from said gate electrode device resulting in the low on resistance of the MOS transistor device;
   a body region of a second conductivity type disposed substantially between said source region and said drain region in a manner insulated from said gate electrode device;
   a body reinforcement region of said second conductivity type reinforcing said body region in a direction toward said drain region; and
   said drain region having a doping spur, and said region of local maximum dopant concentration of said first conductivity type being disposed in an area of a position located in a transition from one of said body region and said body reinforcement region to said doping spur of said drain region.

2. The MOS transistor device according to claim 1, wherein said avalanche breakdown region includes and is defined by an area of maximum electric field strength.

3. The MOS transistor device according to claim 2, wherein said area of maximum electric field strength is formed between said source region and said drain region in direct proximity to said insulation region and to said region of said trench structure in a manner remote from said gate electrode device.

4. The MOS transistor device according to claim 2, wherein said area of maximum electric field strength is formed between said source region and said drain region in direct proximity to said region of said trench structure and in a manner remote from said gate electrode device.

5. The MOS transistor device according to claim 2, wherein:

said area of maximum electric field strength is formed between said source region and said drain region in direct proximity to said region of said trench structure and remote from said gate electrode device, said area of maximum electrical field strength is further disposed in an area of a space charge zone formed when a breakdown voltage is present between one of said body region and said body reinforcement region and said drain region.

6. The MOS transistor device according to claim 5, wherein said semiconductor region has a lower half and said area of maximum electrical field strength is disposed in said lower half.

7. The MOS transistor device according to claim 1, wherein:

said semiconductor region has a first subregion and a second subregion; and said trench structure reaches approximately as far as said first subregion of said semiconductor region.

8. The MOS transistor device according to claim 7, further comprising a substrate and said semiconductor region is one of formed in and supported by said substrate, and said trench structure reaches into said substrate.

9. The MOS transistor device according to claim 7, wherein:

said drain region is disposed on a same side of said semiconductor region as said source region and avoids a rear side contact connection of said semiconductor region to a greatest possible extent; and said first subregion is highly n-doped and formed as a terminal zone in a laterally offset fashion such that said first subregion extends as far as a surface region of one of said semiconductor region and said second subregion.

10. The MOS transistor device according to claim 7, further comprising a substrate and said semiconductor region is one of formed in and supported by said substrate, and said trench structure reaches to said substrate.

11. The MOS transistor device according to claim 1, further comprising a plurality of electrode devices disposed in said trench structure for forming a plurality of gate regions and a plurality of source regions.

12. The MOS transistor device according to claim 1, wherein said body region is disposed in direct proximity to said source region.

13. A MOS transistor device, comprising:

a semiconductor region having a trench structure formed therein extending substantially in a given direction;

an avalanche breakdown region formed in a region selected from the group consisting of an end region of said trench structure, a lower region of said trench structure, and a bottom region of said trench structure resulting in a low on resistance for the MOS transistor device;

a source region having a given conductivity type and formed in said semiconductor region;

a drain region having said given conductivity type and formed in said semiconductor region;

a gate electrode device formed substantially between said source region and said drain region in an interior of said trench structure;

an insulation region disposed in said trench structure and insulating said gate electrode device;

a region having a locally maximum dopant concentration of said given conductivity type disposed between said source region and said drain region in direct proximity to said insulation region and remote from said gate electrode device resulting in the low on resistance of the MOS transistor device; and a mesa region formed in said semiconductor region as an intermediate region, said mesa region having in a direction running substantially perpendicular to said given direction a width $D_{Mesa}$ being lees than a width $D_{Trench}$ of said trench structure.

14. A MOS transistor device, comprising:

a semiconductor region having a trench structure formed therein extending substantially in a given direction;

an avalanche breakdown region formed in a region selected from the group consisting of an end region of said trench structure, a lower region of said trench structure, and a bottom region of said trench structure resulting in a low on resistance for the MOS transistor device;

a source region having a given conductivity type and formed in said semiconductor region;

a drain region having said given conductivity type and formed in said semiconductor region;

a gate electrode device formed substantially between said source region and said drain region in an interior of said trench structure;

an insulation region disposed in said trench structure and insulating said gate electrode device;

a region having a locally maximum dopant concentration of said given conductivity type disposed between said source region and said drain region in direct proximity to said insulation region and remote from said gate electrode device resulting in the low on resistance of the MOS transistor device; and a mesa region formed in said semiconductor region as an intermediate region, said mesa region in a direction running substantially perpendicular to said given direction having a width $D_{Mesa}$ being less than 2.5 times a maximum thickness $D_{GOX}$ of said insulation region.

15. A MOS transistor device, comprising:

a semiconductor region having a trench structure formed therein extending substantially in a given direction;

an avalanche breakdown region formed in a region selected from the group consisting of an end region of said trench structure, a lower region of said trench structure, and a bottom region of said trench structure resulting in a low on resistance for the MOS transistor device;

a source region having a given conductivity type and formed in said semiconductor region;

a drain region having said given conductivity type and formed in said semiconductor region;

a gate electrode device formed substantially between said source region and said drain region in an interior of said trench structures;

an insulation region disposed in said trench structure and insulating said gate electrode device; and a region having a locally maximum dopant concentration of said given conductivity type disposed between said source region and said drain region in direct proximity to said insulation region and remote from said gate electrode device resulting in the low on resistance of the MOS transistor device;

said insulation region having a field plate structure resulting in the MOS transistor device being a field plate transistor device.

16. A MOS transistor device, comprising:

a semiconductor region;

a source region having a first conductivity type and formed in said semiconductor region;

a drain region having said first conductivity type and formed in said semiconductor region;

a gate electrode device having an insulation region disposed in-between said source region and said drain region;

a region of local maximum dopant concentration of said first conductivity disposed substantially between said source region and said drain region in direct proximity to said insulation region in a manner remote from said gate electrode device resulting in a low on resistance of the MOS transistor device;

a body region of a second conductivity type disposed substantially between said source region and said drain region in a manner insulated from said gate electrode device;

a body reinforcement region of said second conductivity type reinforcing said body region in a direction toward said drain region; and said drain region having a doping spur, and said region of local maximum dopant concentration of said first conductivity type being disposed in an area of a position located in a transition from one of said body region and said body reinforcement region and said doping spur of said drain region.

17. The MOS transistor device according to claim 16, wherein said body region is disposed in direct proximity to said source region.

18. The MOS transistor device according to claim 16, wherein:

said semiconductor region has a trench structure formed therein extending substantially in a given direction in said semiconductor region, said gate electrode device is disposed in said trench structure; and said semiconductor region has an avalanche breakdown region formed in a region of said trench structure selected from the group consisting of an end region of said trench structure, a lower region of said trench structure and a bottom region of said trench structure, resulting in the low on resistance of the MOS transistor device.

19. The MOS transistor device according to claim 18, wherein said avalanche breakdown region includes and is defined by an area of maximum electric field strength.

20. The MOS transistor device according to claim 19, wherein said area of maximum electric field strength is formed between said source region and said drain region in direct proximity to said insulation region and to said region of said trench structure in a manner remote from said gate electrode device.

21. The MOS transistor device according to claim 19, wherein said area of maximum electric field strength is formed between said source region and said drain region in direct proximity to said region of said trench structure and in a manner remote from said gate electrode device.

22. The MOS transistor device according to claim 19, wherein said area of maximum electric field strength is formed between said source region and said drain region in direct proximity to said region of said trench structure and in a manner remote from said gate electrode device, said area of maximum electrical field strength further disposed in an area of a space charge zone formed when a breakdown voltage is present between one of said body region and said body reinforcement region and said drain region.

23. The MOS transistor device according to claim 22, wherein said semiconductor region has a lower half and said area of maximum electrical field strength is disposed in said lower half.

24. The MOS transistor device according to claim 18, wherein:

said semiconductor region has a first subregion and a second subregion; and said trench structure reaches approximately as far as said first subregion of said semiconductor region.

25. The MOS transistor device according to claim 24, further comprising a substrate and said semiconductor region is one of formed in and supported by said substrate, and said trench structure reaches into said substrate.

26. The MOS transistor device according to claim 24, wherein:

said drain region is disposed on a same side of said semiconductor region as said source region and avoids a rear side contact connection of said semiconductor region to a greatest possible extent; and said first subregion is highly n-doped and formed as a terminal zone in a laterally offset fashion such that said first subregion extends as far as a surface region of one of said semiconductor region and said second subregion.

27. The MOS transistor device according to claim 24, further comprising a substrate and said semiconductor region is one of formed in and supported by said substrate, and said trench structure reaches to said substrate.

28. The MOS transistor device according to claim 18, further providing a plurality of electrode devices disposed in said trench structure for forming a plurality of gate regions and a plurality of source regions.

29. A MOS transistor device, comprising:

a semiconductor region;

a source region having a given conductivity type and formed in said semiconductor region;

a drain region having said given conductivity type and formed in said semiconductor region;

a gate electrode device having an insulation region disposed in-between said source region and said drain region;

a region of local maximum dopant concentration of said given conductivity disposed substantially between said source region and said drain region in direct proximity to said insulation region in a manner remote from said gate electrode device resulting in a low on resistance of the MOS transistor device; and a mesa region formed in said semiconductor region as an intermediate region, said mesa region having in a direction running substantially perpendicular to said given direction a width $D_{Mesa}$ being less than a width $D_{Trench}$ of said trench structure.

30. A MOS transistor device, comprising:

a semiconductor region;

a source region having a given conductivity type and formed in said semiconductor region;

a drain region having said given conductivity type and formed in said semiconductor region;

a gate electrode device having an insulation region disposed in-between said source region and said drain region;

a region of local maximum dopant concentration of said given conductivity disposed substantially between said source region and said drain region in direct proximity to said insulation region in a manner remote from said gate electrode device resulting in a low on resistance of the MOS transistor device; and a mesa region formed in said semiconductor region as an intermediate region, said mesa region in a direction running substantially perpendicular to said given direction having a width $D_{Mesa}$ being less than 2.5 times a maximum thickness $D_{GOX}$ of said insulation region.

31. A MOS transistor device, comprising:

a semiconductor region;

a source region having a given conductivity type and formed in said semiconductor region;

a drain region having said given conductivity type and formed in said semiconductor region;

a gate electrode device having an insulation region disposed in-between said source region and said drain region;

a region of local maximum dopant concentration of said given conductivity disposed substantially between said source region and said drain region in direct proximity to said insulation region in a manner remote from said gate electrode device resulting in a low on resistance of the MOS transistor device; and said insulation region having a field plate structure resulting in the MOS transistor device being a field plate transistor device.

32. A MOS transistor device, comprising:

a semiconductor region having a trench structure formed therein extending substantially in a given direction;

an avalanche breakdown region formed in a region selected from the group consisting of an end region of said trench structure, a lower region of said trench structure, and a bottom region of said trench structure resulting in a low on resistance for the MOS transistor device; and a mesa region formed in said semiconductor region as an intermediate region, said mesa region having, in a direction running substantially perpendicular to said given direction, a width being less than a width of said trench structure.

33. A MOS transistor device, comprising:

a semiconductor region having a trench structure formed therein extending substantially in a given direction;

an insulation region disposed in said trench structure;

an avalanche breakdown region formed in a region selected from the group consisting of an end region of said trench structure, a lower region of said trench structure, and a bottom region of said trench structure resulting in a low on resistance for the MOS transistor device; and a mesa region formed in said semiconductor region as an intermediate region, said mesa region having, in a direction running substantially perpendicular to said given direction, a width being less than 2.5 times a maximum thickness of said insulation region.

* * * * *